United States Patent
Chen et al.

(10) Patent No.: US 10,878,151 B1
(45) Date of Patent: Dec. 29, 2020

(54) GLITCH OCCURRING POINT DETECTION APPARATUS AND METHOD

(71) Applicant: REALTEK SEMICONDUCTOR CORPORATION, Hsinchu (TW)

(72) Inventors: Ying-Chieh Chen, Hsinchu (TW); Mei-Li Yu, Hsinchu (TW); Yu-Lan Lo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/843,720

(22) Filed: Apr. 8, 2020

(30) Foreign Application Priority Data

Oct. 14, 2019 (TW) .............................. 108136823 A

(51) Int. Cl.
G06F 30/30 (2020.01)
G06F 30/33 (2020.01)
(52) U.S. Cl.
CPC .................................. G06F 30/33 (2020.01)
(58) Field of Classification Search
CPC ........................................................ G06F 30/33
USPC ........................................................ 716/106
See application file for complete search history.

(56) References Cited

U.S. PATENT DOCUMENTS

| 5,838,947 | A | * | 11/1998 | Sarin | G06F 30/33 703/14 |
| 8,707,244 | B1 | * | 4/2014 | Milton | G06F 30/331 716/136 |
| 8,884,685 | B1 | | 11/2014 | Petrovic | |
| 10,726,179 | B1 | * | 7/2020 | Dose | G06F 30/33 |
| 2006/0009959 | A1 | * | 1/2006 | Fischer | G06F 30/367 703/18 |
| 2010/0079184 | A1 | | 4/2010 | Bowman et al. | |

* cited by examiner

*Primary Examiner* — Jack Chiang
*Assistant Examiner* — Brandon Bowers
(74) *Attorney, Agent, or Firm* — WPAT, PC

(57) ABSTRACT

The present disclosure discloses a glitch occurring point detection method to detect at least one glitch occurring point in an under-test circuit that includes the steps outlined below. An IC design file is retrieved to further retrieve a plurality of input nodes, at least one output node and a plurality of power nodes corresponding to the under-test circuit in the IC design file. Signals are fed to the input nodes and the power nodes such that a DC analysis is performed on a plurality of internal circuit nodes in the under-test circuit and a plurality of candidate floating points that do not have any charging or discharging path connected thereto are retrieved according to the DC analysis. Each of the candidate floating points capable of triggering the output node during the operation of the under-test circuit are determined to be the glitch occurring point.

10 Claims, 3 Drawing Sheets

US 10,878,151 B1

GLITCH OCCURRING POINT DETECTION APPARATUS AND METHOD

BACKGROUND OF THE INVENTION

1. Field of the Invention

The present disclosure relates to a glitch occurring point detection apparatus and a glitch occurring point detection method.

2. Description of Related Art

During the operation of an integrated circuit (IC), glitches may occur in internal circuit nodes and result in a false output result. For example, when a set of specific input signals are fed, an output node of the circuit under normal operation condition outputs a first status signal. However, a node in the circuit that supposes to have a low level voltage may become a high level voltage once a larger glitch occurs such that the operation of a circuit component controlled by the node changes to force the output node to output a second status signal that is opposite to the first status signal.

A common glitch error detection method not only needs to feed all possible groups of input signals to the under-test circuit, but also needs to feed the groups of input signals based on different orders to obtain a comprehensive observation of all the possibilities of the signal changes. Such a method requires a large amount of signal feeding and is thus time-consuming and not beneficial for accomplishing an efficient circuit design and error detection process.

SUMMARY OF THE INVENTION

In consideration of the problem of the prior art, an object of the present disclosure is to provide a glitch occurring point detection apparatus and a glitch occurring point detection method.

The present disclosure discloses a glitch occurring point detection apparatus that includes a memory and a processing circuit and used to detect at least one glitch occurring point in an under-test circuit. The memory is configured to store an integrated circuit (IC) design file corresponding to the under-test circuit and a plurality of computer readable commands. The processing circuit is configured to retrieve and execute the computer readable commands from the memory to execute a glitch occurring point detection method that includes the steps outlined below. The IC design file is retrieved from the memory to further retrieve a plurality of input nodes, at least one output node and a plurality of power nodes corresponding to the under-test circuit. Signals are fed to the input nodes and the power nodes, a DC analysis is performed on a plurality of internal circuit nodes in the under-test circuit and a plurality of candidate floating points that do not have any charging or discharging path connected thereto are retrieved according to the DC analysis. Each of the candidate floating points capable of triggering the output node during the operation of the under-test circuit is determined to be the glitch occurring point.

The present disclosure also discloses a glitch occurring point detection method used to detect at least one glitch occurring point in an under-test circuit that includes the steps outlined below. An IC design file is retrieved to further retrieve a plurality of input nodes, at least one output node and a plurality of power nodes corresponding to an under-test circuit in the IC design file. Signals are fed to the input nodes and the power nodes, a DC analysis is performed on a plurality of internal circuit nodes in the under-test circuit and a plurality of candidate floating points that do not have any charging or discharging path connected thereto are retrieved according to the DC analysis. Each of the candidate floating points capable of triggering the output node during the operation of the under-test circuit is determined to be the glitch occurring point.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a glitch occurring point detection apparatus and a glitch occurring point detection method to filter out candidate floating points by using direct current (DC) and determine each of the candidate floating points capable of triggering an output node of an under-test circuit during operation to be a glitch occurring point. A quick detection of the glitch occurring point can be accomplished.

Figure 1:
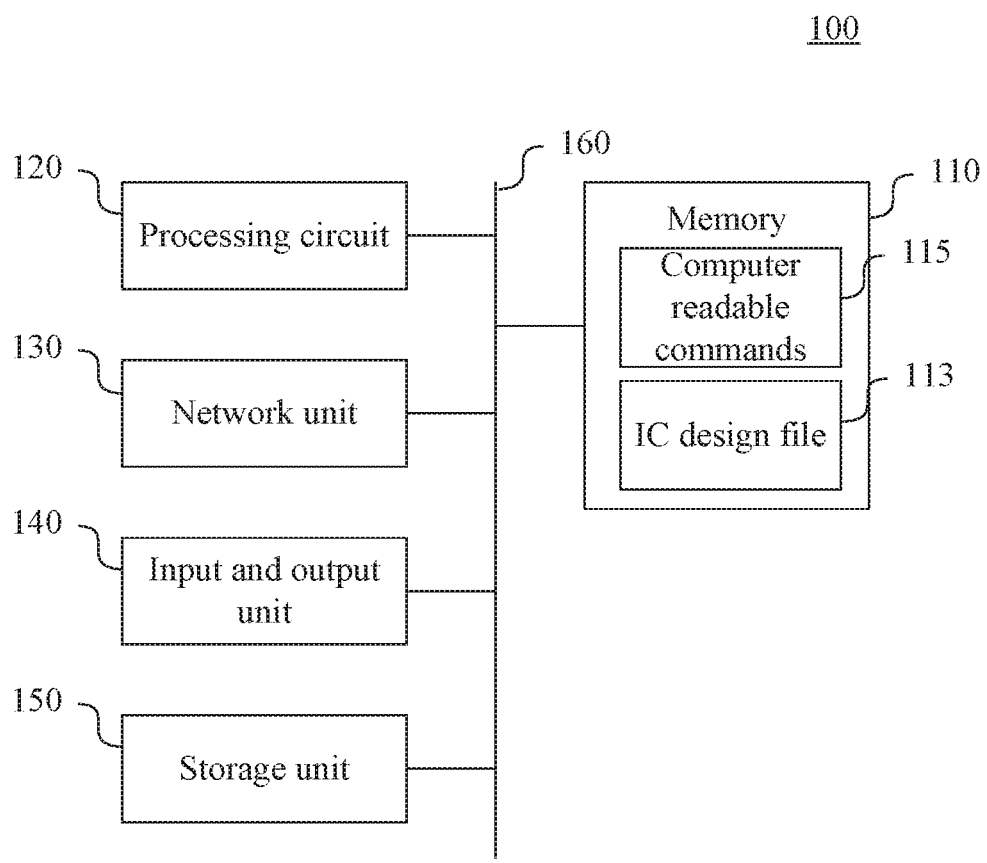
FIG. 1 illustrates a block diagram of a glitch occurring point detection apparatus according to an embodiment of the present invention.

Reference is now made to FIG. 1. FIG. 1 illustrates a block diagram of a glitch occurring point detection apparatus 100 according to an embodiment of the present invention. The glitch occurring point detection apparatus 100 includes a memory 110, a processing circuit 120, a network unit 130, an input and output unit 140 and a storage unit 150. The components described above can communicate with each other by using such as, but not limited to a bus 160.

The memory 110 can be any storage device used to store data and can be such as, but not limited to a random access memory (RAM), a read only memory (ROM), a flash memory, a hard drive or other storage devices capable of storing data. The memory 110 is configured to at least store an integrated circuit (IC) design file 113 and a plurality of computer readable commands 115. In an embodiment, the memory 110 can also store temporary data of the processing circuit 120 during operation.

The processing circuit 120 is electrically coupled to the memory 110 and is configured to retrieve the computer readable commands 115 from the memory 110 to control the components in the glitch occurring point detection apparatus 100 to execute the function of the glitch occurring point detection apparatus 100 to perform detection of the glitch occurring point on an under-test circuit that the IC design file 113 corresponds to.

The network unit 130 is configured to perform network accessing under the control of the processing circuit 120. The input and output unit 140 can be operated by a user to perform communication with the processing circuit 120 to further perform data input and data output. The storage unit 150 can be such as, but not limited to a floppy disc or an optical disc configured to store data or commands under the control of the processing circuit 120.

Figure 2:
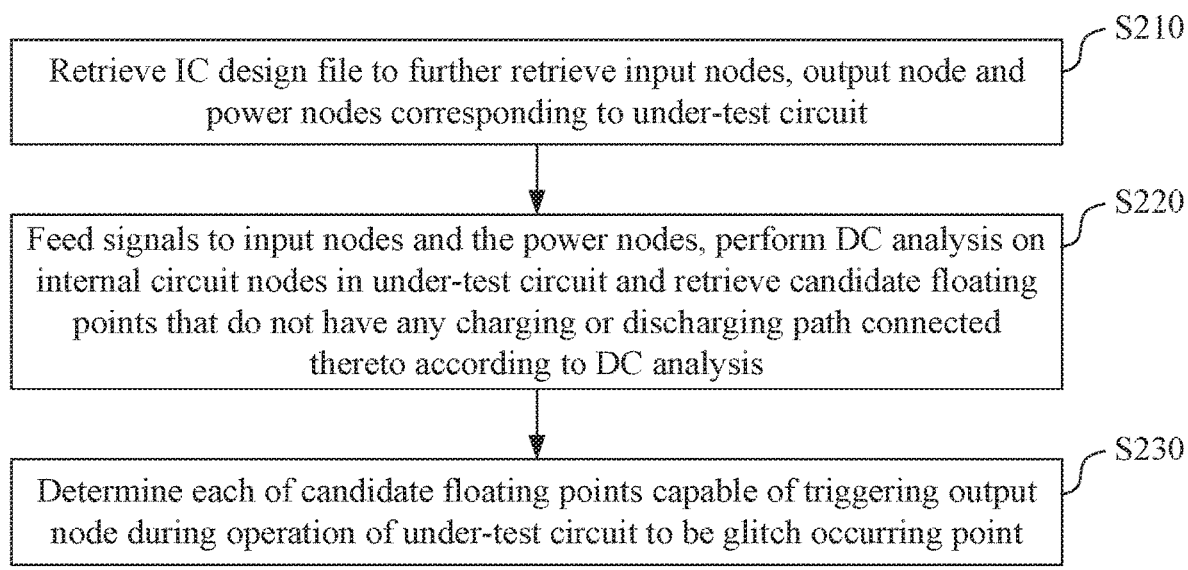
FIG. 2 illustrates a flow chart of a glitch occurring point detection method according to an embodiment of the present invention.

Reference is now made to FIG. 2. FIG. 2 is a flow chart of a glitch occurring point detection method 200. The glitch occurring point detection method 200 can be used in the glitch occurring point detection apparatus 100 illustrated in FIG. 1 or can be implemented by other hardware units, e.g. a database, a processor, a computer, a server, other unique hardware devices equipped with specific logic circuits or equipment having specific function, e.g. a unique hardware integrating program codes and processors or chips. More specifically, the glitch occurring point detection method 200 can be implemented by a computer program to control the components of the glitch occurring point detection apparatus 100. The computer program can be stored in a non-transitory computer readable medium, e.g. ROM, flash memory, floppy disc, hard drive, optical disc, portable hard drive, magnetic tape, database accessible through internet or other computer readable medium having the same function that those of ordinary skill in the art can understand.

The glitch occurring point detection method 200 includes the steps outlined below (The operations are not recited in the sequence in which the operations are performed. That is, unless the sequence of the operations is expressly indicated, the sequence of the operations is interchangeable, and all or part of the steps may be simultaneously, partially simultaneously, or sequentially performed).

In step S210, the IC design file 113 is retrieved to further retrieve a plurality of input nodes, at least one output node and a plurality of power nodes corresponding to the under-test circuit.

In an embodiment, the IC design file 113 may include such as, but not limited to a simulation program with integrated circuit emphasis (SPICE) netlist and a power/ground (PG) netlist. However, the present invention is not limited thereto.

Figure 3:
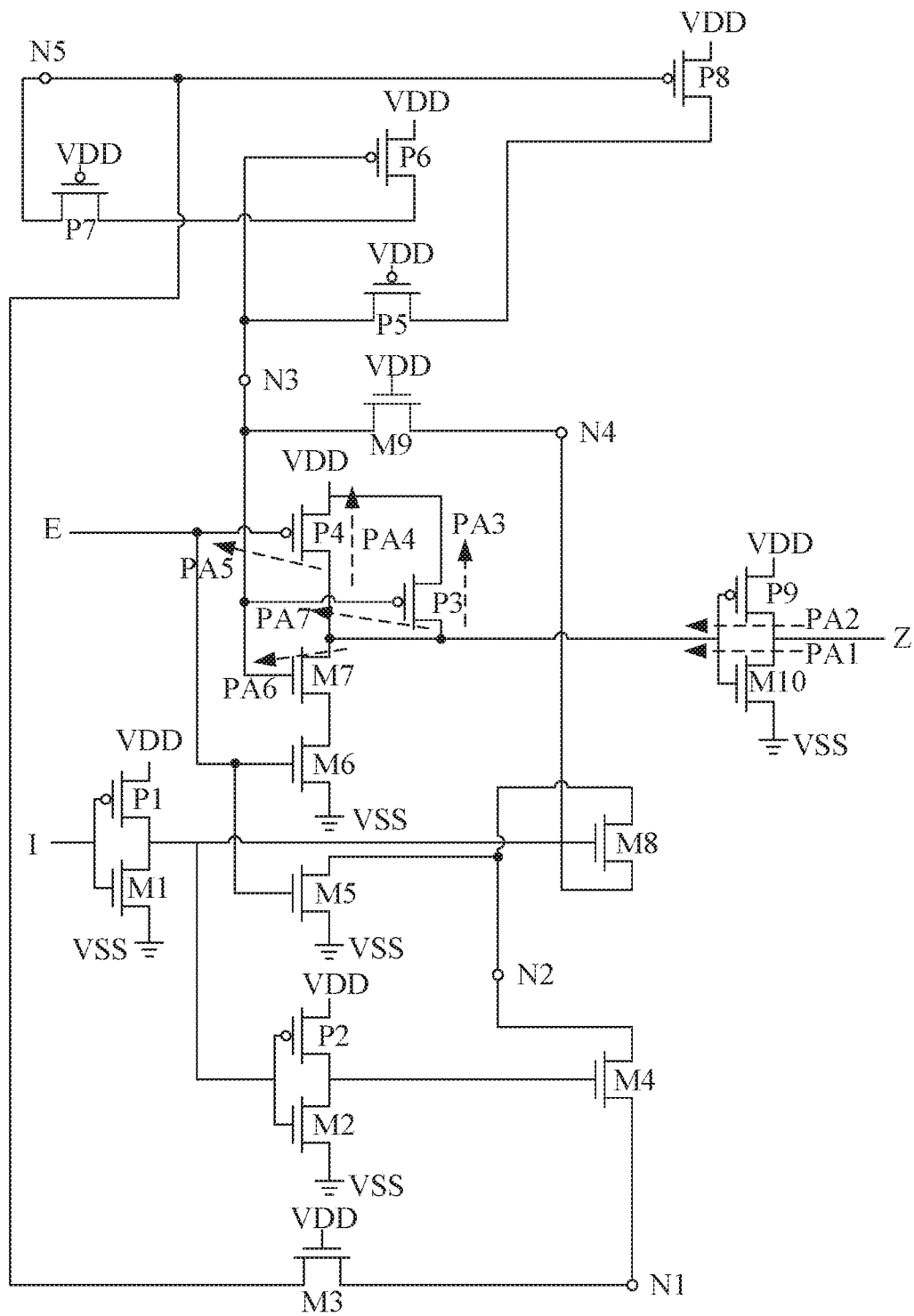
FIG. 3 illustrates a circuit diagram of an under-test circuit corresponding to the IC design file according to embodiment of the present invention.

Reference is now made to FIG. 3. FIG. 3 is a circuit diagram of an under-test circuit 300 corresponding to the IC design file 113 according to embodiment of the present invention.

As illustrated in FIG. 3, the under-test circuit 300 is an AND gate and includes a plurality of circuit components, such as, but not limited to NMOS transistors M1~M10 and PMOS transistors P1~P9. The NMOS transistors M1~M10 and the PMOS transistors P1~P9 are electrically coupled together to form a plurality of internal circuit nodes of the under-test circuit 300.

The under-test circuit 300 includes two input nodes I and E and an output node Z. The input node I corresponds to the gates of the NMOS transistor M1 and the PMOS transistor P1. The input node E corresponds to the gate of the PMOS transistor P4. The output node Z corresponds to the drains of the NMOS transistor M10 and the PMOS transistor P9. As described above, in the present embodiment, the under-test circuit 300 is an AND gate. As a result, the output node Z is at a high status only when both the input node I and the input node E are at a high status.

It is appreciated that the configuration, the number of the input and output nods and the function of the under-test circuit 300 described above are merely an example. In other embodiments, the under-test circuit 300 may include different configurations and different numbers of the input and output nodes and may perform different functions. The present invention is not limited thereto.

The under-test circuit 300 further includes a plurality of power nodes. The power nodes include non-grounding power nodes VDD and grounding power nodes VSS.

As a result, through the IC design file 113, the input nodes I and E, the output node E and the power nodes including the non-grounding power nodes VDD and the grounding power nodes VSS included in the under-test circuit 300 can be retrieved.

In step S220, signals are fed to the input nodes I and E and the power nodes (e.g. the non-grounding power nodes VDD and the grounding power nodes VSS), a DC analysis is performed on a plurality of internal circuit nodes in the under-test circuit 300 and a plurality of candidate floating points that do not have any charging or discharging path connected thereto are retrieved according to the DC analysis.

In an embodiment, in the step described above, a driving parameter of the circuit components included in the under-test circuit 300 can be set first. For example, when the circuit components are the NMOS transistors M1~M10 and the PMOS transistors P1~P9, the driving parameter can be such as, but not limited to the gate voltage thereof. The gate voltage of each of the NMOS transistors M1~M10 is a positive value. The gate voltage of each of the PMOS transistors P1~P9 is a negative value.

The step of feeding the signals can be performed by feeding a plurality groups of input signals to the input nodes I and E first, in which each of the groups of input signals are a signal combination corresponding to the input nodes. In the present embodiment, the under-test circuit 300 includes two input nodes I and E. As a result, the groups of the signals fed thereto can be four combinations of (00), (01), (10) and (11). It is appreciated that the above combinations can be fed once in any order.

Subsequently, the step of feeding the signals can be performed by feeding power signals to the power nodes, in which the power signals can be non-grounding power signals and grounding power signals. The non-grounding power signals are fed to the non-grounding power nodes VDD. The grounding power signals are fed to the grounding power nodes VSS.

The DC analysis is performed by using a simulation of operation of the circuit components included in the under-test circuit 300 according to the power signals and the input signals such that the power signals and the groups of the input signals are transmitted in the internal circuit nodes of the circuit components.

More specifically, by using the driving parameter described above, the NMOS transistors M1~M10 and the PMOS transistors P1~P9 included in the under-test circuit 300 can be simulated to operate to be turned on or turned off according to the power signals fed to the non-grounding power nodes VDD and the grounding power nodes VSS and according to the input signals fed to the input nodes I and E. The power signals and the input signals are thus transmitted in the internal circuit nodes and the output signal is generated at the output node Z accordingly.

At last, the DC analysis is performed to determine a plurality of floating nodes in the internal circuit nodes that are not able to transmit the power signal and/or the groups of the input signals and assign the floating nodes as the candidate floating points.

For example, when the input signals fed to the input nodes I and E is (00), the transistors electrically coupled to the nodes N1~N5 are turned off and are not able to transmit the power signals and/or the input signals. Electric charges are easily accumulated at such floating points and these floating points become the candidate floating points N1~N5.

Besides, when the input signals fed to the input nodes I and E are (01), (10) and (11), no such floating point exists in the under-test circuit 300. However, it is appreciated that the under-test circuit 300 having the function of the AND gate is used as an example. In other embodiments, the under-test circuits having other functions may have floating points under different combinations of the input signals. The present invention is not limited thereto.

In step S230, each of the candidate floating points N1~N5 capable of triggering the output node Z during the operation of the under-test circuit 300 is determined to be the glitch occurring point.

In an embodiment, the determination of whether the candidate floating points N1~N5 are capable of triggering the output node Z during the operation of the under-test circuit 300 can be performed by setting a plurality of paths in the under-test circuit 300 each are conducing through either from a source to a drain of a transistor or from a gate to a drain of a transistor and backtracking the paths from the output node to determine at least one of the candidate floating points on the paths closest to the output node Z to be the glitch occurring point.

In practical implementation, the process to backtrack the paths from the output node Z can performed by setting the candidate floating points N1~N5, the power nodes (the non-grounding power nodes VDD and the grounding power nodes VSS) and the input nodes I and E as a plurality of backtracking stop nodes and stopping backtracking when any one of the backtracking stop nodes on the paths are encountered during backtracking.

Take the under-test circuit 300 in FIG. 3 as an example, the process to backtrack of the paths starts from the output node Z. The path PA1 corresponding to the conducting path from the gate to the drain of the NMOS transistor M10 and the path PA2 corresponding to the conducting path from the gate to the drain of the PMOS transistor P9 are tracked first and further to the internal circuit nodes corresponding to the gates of the NMOS transistor M10 and the PMOS transistor P9. However, these internal circuit nodes are not candidate floating points. The backtracking process continues to be performed.

The backtracking process further continues to the path PA3 corresponding to the conducting path from the source to the drain of the PMOS P3 and the path PA4 corresponding to the conducting path from the source to the drain of the PMOS P4. The non-grounding power nodes VDD are met. In another aspect, the backtracking process also continues to the path corresponding to the conducting path from the gate to the drain of the PMOS P4. The input node E is met. The backtracking of the paths mentioned above all meet the defined backtracking stop nodes. As a result, the backtracking process stops.

In yet another aspect, the backtracking process further continues to the path PA6 corresponding to the conducting path from the gate to the drain of the NMOS M7 and the path PA7 corresponding to the conducting path from the gate to the drain of the PMOS P3. The candidate floating point N3, which is one of the backtracking stop nodes, is met and the backtracking process stops. Since the candidate floating point N3 is one of the candidate floating points closest to the output node Z, the candidate floating point N3 is capable of triggering the output node Z during the operation of the under-test circuit 300.

More specifically, the candidate floating point N3 affects the turn-on and turn-off of the PMOS transistor P3 and the PMOS transistor P4 that further affect the voltage level of the gates of the NMOS transistor M9 and the PMOS transistor P10 and finally affects the output signal of the output node Z. Such a candidate floating point N3 is capable of triggering the output node Z during the operation of the under-test circuit 300 and is determined to be the glitch occurring point.

For example, in an operation scenario, the under-test circuit 300 receives the input signals of (00) and operates in a first status and further receives the input signals of (10) and operates in a second status. When the input signals (10) are received, the candidate floating point N3 is at the low status when the under-test circuit 300 operates normally to turn on the PMOS transistor P3 and turn off the NMOS transistor M7 and pull high the voltage of the drain of the PMOS transistor P3, the voltage of the gate of the NMOS transistor M9 and the voltage of the gate of the PMOS transistor P10. The NMOS transistor M9 and the PMOS transistor P10 turns on and turns off respectively such that the output node Z outputs a low status signal.

However, since the under-test circuit 300 receives the input signals of (00) in advance to operate in the first status, electric charges are easy to accumulate at the candidate floating point N3 since the candidate floating point N3 is floating. When the electric charges are not able to be discharged such that the voltage of the candidate floating point N3 is too high to be the glitch, the PMOS transistor P3 and the NMOS transistor M7 may turn off and turn on respectively under the condition that the under-test circuit 300 receives the input signals of (10). The voltages of the gates of the NMOS transistor M9 and the PMOS transistor P10 are pulled low such that the output node Z outputs a high status signal, which is a false result.

As a result, by using the method described above, the glitch occurring point in the under-test circuit 300 can be found quickly such that the circuit designer can arrange a discharging path for the glitch occurring point in the design of the under-test circuit 300 according to the position of the glitch occurring point to avoid the occurrence of false output result.

In some approaches, in order to find the glitch occurring point, not only different groups of input signals are required to be fed to the under-test circuit, but also the group of input signals in different orders are required to be fed to the under-test circuit to observe the occurrence of the glitches in the time domain. Take the under-test circuit 300 in FIG. 3 that receives two input signals as an example, different orders of different groups of signals, e.g. (00,10,01,11), (00,10,11,01), (00,01,10,11), (00,01,11,10), (00,01,11, 10) . . . , are required to be fed. Such a method requires $(2^n)! - C_1^{n-1} \times 2!$ times signal inputs when n input nodes are presented in the under-test circuit.

The glitch occurring point detection apparatus and the glitch occurring point detection method of the present invention can retrieve the candidate floating points easy to accumulate electric charges in the under-test circuit and find the glitch occurring point that is easy to affect the output node among the candidate floating points by performing backtracking from the output node. As a result, in the glitch occurring point detection apparatus and the glitch occurring point detection method, only $2^n$ times of signal inputs are required when n input nodes are presented in the under-test circuit. In comparison with the method to comprehensively feed different groups of input signals with different orders, the cost of the detection time can be greatly reduced such that the false transmission result of the under-test circuit can be avoided.

It is appreciated that the embodiments described above are merely an example. In other embodiments, it should be appreciated that many modifications and changes may be made by those of ordinary skill in the art without departing, from the spirit of the invention.

In summary, the glitch occurring point detection apparatus and the glitch occurring point detection method of the present invention can filter out candidate floating points by using direct current (DC) and determine each of the candidate floating points capable of triggering an output node of an under-test circuit during operation to be a glitch occurring point. A quick detection of the glitch occurring point can be accomplished.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A glitch occurring point detection apparatus used to detect at least one glitch occurring point in an under-test circuit, comprising:
   a memory configured to store an integrated circuit (IC) design file corresponding to the under-test circuit and a plurality of computer readable commands; and
   a processing circuit configured to retrieve and execute the computer readable commands from the memory to execute a glitch occurring point detection method comprising:
      retrieving the IC design file from the memory to further retrieve a plurality of input nodes, at least one output node and a plurality of power nodes corresponding to the under-test circuit;
      feeding signals to the input nodes and the power nodes, performing a DC analysis on a plurality of internal circuit nodes in the under-test circuit and retrieving a plurality of candidate floating points that do not have any charging or discharging path connected thereto according to the DC analysis; and
      determining each of the candidate floating points capable of triggering the output node during the operation of the under-test circuit to be the glitch occurring point.

2. The glitch occurring point detection apparatus of claim 1, wherein the step of feeding the signals to the input nodes and the power nodes to retrieve the candidate floating points further comprises:
   setting a driving parameter of a plurality circuit components comprised in the under-test circuit;
   feeding a power signal to the power nodes, wherein the power signal is a non-grounding power signal or a grounding power signal;
   feeding a plurality of groups of input signals to the input nodes, wherein each of the groups of input signals are a signal combination corresponding to the input nodes;
   operating the circuit components according to the power signal and the groups of the input signals such that the power signal and the groups of the input signals are transmitted in the internal circuit nodes of the circuit components; and
   determining a plurality of floating nodes in the internal circuit nodes that are not able to transmit the power signal and/or the groups of the input signals and assigning the floating nodes as the candidate floating points.

3. The glitch occurring point detection apparatus of claim 2, wherein the circuit components comprise at least a NMOS transistor and/or a PMOS transistor, and the driving parameter is a gate voltage of the NMOS transistor and the PMOS transistor.

4. The glitch occurring point detection apparatus of claim 1, wherein the step of determining the glitch occurring point further comprises:
   setting a plurality of paths in the under-test circuit each are conducing through either from a source to a drain or from a gate to a drain of a transistor; and
   backtracking the paths from the output node to determine at least one of the candidate floating points on the paths closest to the output node to be the glitch occurring point.

5. The glitch occurring point detection apparatus of claim 4, wherein the step of backtracking the paths further comprises:
   setting the candidate floating points, the power nodes and the input nodes as a plurality of backtracking stop nodes; and
   stopping backtracking when any one of the backtracking stop nodes on the paths are encountered during backtracking.

6. A glitch occurring point detection method used to detect at least one glitch occurring point in an under-test circuit, comprising:
   retrieving an IC design file to further retrieve a plurality of input nodes, at least one output node and a plurality of power nodes corresponding to an under-test circuit in the IC design file;
   feeding signals to the input nodes and the power nodes, performing a DC analysis on a plurality of internal circuit nodes in the under-test circuit and retrieving a plurality of candidate floating points that do not have any charging or discharging path connected thereto according to the DC analysis; and
   determining each of the candidate floating points capable of triggering the output node during the operation of the under-test circuit to be the glitch occurring point.

7. The glitch occurring point detection method of claim 6, wherein the step of feeding the signals to the input nodes and the power nodes to retrieve the candidate floating points further comprises:
   setting a driving parameter of a plurality circuit components comprised in the under-test circuit;
   feeding a power signal to the power nodes, wherein the power signal is a non-grounding power signal or a grounding power signal;
   feeding a plurality of groups of input signals to the input nodes, wherein each of the groups of input signals are a signal combination corresponding to the input nodes;
   operating the circuit components according to the power signal and the groups of the input signals such that the power signal and the groups of the input signals are transmitted in the internal circuit nodes of the circuit components; and
   determining a plurality of floating nodes in the internal circuit nodes that are not able to transmit the power signal and/or the groups of the input signals and assigning the floating nodes as the candidate floating points.

8. The glitch occurring point detection method of claim 7, wherein the circuit components comprise at least a NMOS transistor and/or a PMOS transistor, and the driving parameter is a gate voltage of the NMOS transistor and the PMOS transistor.

9. The glitch occurring point detection method of claim 6, wherein the step of determining the glitch occurring point further comprises:
- setting a plurality of paths in the under-test circuit each are conducing through either from a source to a drain or from a gate to a drain of a transistor; and
- backtracking the paths from the output node to determine at least one of the candidate floating points on the paths closest to the output node to be the glitch occurring point.

10. The glitch occurring point detection method of claim 9, wherein the step of backtracking the paths further comprises:
- setting the candidate floating points, the power nodes and the input nodes as a plurality of backtracking stop nodes; and
- stopping backtracking when any one of the backtracking stop nodes on the paths are encountered during backtracking.

* * * * *